United States Patent
Park et al.

(10) Patent No.: US 9,564,531 B2
(45) Date of Patent: Feb. 7, 2017

(54) THIN FILM TRANSISTORS, METHODS OF MANUFACTURING THIN FILM TRANSISTORS, AND SEMICONDUCTOR DEVICE INCLUDING THIN FILM TRANSISTORS

(75) Inventors: Kyung-Bae Park, Seoul (KR); Myung-Kwan Ryu, Yongin-si (KR); Jong-Baek Seon, Yongin-si (KR); Sang-Yoon Lee, Seoul (KR); Bon-Won Koo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 701 days.

(21) Appl. No.: 13/064,366

(22) Filed: Mar. 22, 2011

(65) Prior Publication Data

US 2011/0227064 A1 Sep. 22, 2011

(30) Foreign Application Priority Data

Mar. 22, 2010 (KR) .................. 10-2010-0025162
Oct. 29, 2010 (KR) .................. 10-2010-0106851

(51) Int. Cl.
*H01L 29/786* (2006.01)
*H01L 29/49* (2006.01)

(52) U.S. Cl.
CPC ....... *H01L 29/7869* (2013.01); *H01L 29/4908* (2013.01)

(58) Field of Classification Search
CPC .................. H01L 29/7869; H01L 29/4908
USPC .............. 257/43, 288, E29.117, E29.273, E29.296, 257/E29.299
See application file for complete search history.

(56) References Cited

U.S. PATENT DOCUMENTS

| 7,339,187 | B2 | 3/2008 | Wager, III et al. |
| 7,855,379 | B2 | 12/2010 | Hayashi et al. |
| 7,906,780 | B2 | 3/2011 | Iwasaki |
| 7,935,964 | B2 | 5/2011 | Kim et al. |
| 8,088,652 | B2 | 1/2012 | Hayashi et al. |
| 8,436,349 | B2 | 5/2013 | Sano et al. |
| 8,450,732 | B2 | 5/2013 | Kim et al. |
| 8,461,583 | B2 | 6/2013 | Yano et al. |

(Continued)

FOREIGN PATENT DOCUMENTS

| EP | 1 737 044 A1 | 12/2006 |
| JP | 2002076356 A | * 3/2002 |

(Continued)

OTHER PUBLICATIONS

European Search Report dated Jun. 15, 2011 in corresponding European Patent Application No. 11159215.0.

(Continued)

*Primary Examiner* — Michele Fan
(74) *Attorney, Agent, or Firm* — Harness, Dickey & Pierce, P.L.C.

(57) ABSTRACT

Thin film transistors including a semiconductor channel disposed between a drain electrode and a source electrode; and a gate insulating layer disposed between the semiconductor channel and a gate electrode wherein the semiconductor channel includes a first metal oxide, the gate insulating layer includes a second metal oxide, and at least one metal of the second metal oxide is the same as at least one metal of the first metal oxide, methods of manufacturing thin film transistors, and semiconductor device including thin film transistors.

10 Claims, 6 Drawing Sheets

(56) References Cited

U.S. PATENT DOCUMENTS

| | | | |
|---|---|---|---|
| 8,723,175 B2 | 5/2014 | Yano et al. | |
| 8,791,457 B2 | 7/2014 | Yano et al. | |
| 8,921,473 B1* | 12/2014 | Hyman | C08K 3/04 423/445 R |
| 2006/0003485 A1 | 1/2006 | Hoffman et al. | |
| 2006/0038242 A1* | 2/2006 | Hsu et al. | 257/407 |
| 2006/0102931 A1* | 5/2006 | Kopley et al. | 257/192 |
| 2007/0194379 A1 | 8/2007 | Hosono et al. | |
| 2007/0272922 A1 | 11/2007 | Kim et al. | |
| 2008/0237600 A1 | 10/2008 | Miyazaki et al. | |
| 2008/0308804 A1* | 12/2008 | Akimoto | H01L 27/1225 257/59 |
| 2008/0315200 A1 | 12/2008 | Kim et al. | |
| 2009/0159880 A1* | 6/2009 | Honda | H01L 29/7869 257/43 |
| 2009/0174012 A1* | 7/2009 | Iwasaki | H01L 29/4908 257/410 |
| 2009/0305468 A1* | 12/2009 | Jung | H01L 29/66969 438/151 |
| 2010/0025674 A1* | 2/2010 | Kim et al. | 257/43 |
| 2010/0044701 A1* | 2/2010 | Sano et al. | 257/43 |
| 2010/0051934 A1 | 3/2010 | Choung et al. | |
| 2010/0051936 A1* | 3/2010 | Hayashi et al. | 257/43 |
| 2010/0072480 A1* | 3/2010 | Yoo et al. | 257/66 |
| 2010/0243994 A1* | 9/2010 | Yoon et al. | 257/40 |
| 2010/0244031 A1* | 9/2010 | Akimoto et al. | 257/57 |
| 2011/0057185 A1* | 3/2011 | Peng et al. | 257/43 |

FOREIGN PATENT DOCUMENTS

| | | | |
|---|---|---|---|
| JP | 2004155637 A | | 6/2004 |
| JP | 2006134789 A | | 5/2006 |
| JP | 2007-042689 A | | 2/2007 |
| JP | 2007042689 A | * | 2/2007 |
| JP | 2007-073701 A | | 3/2007 |
| JP | 2007073701 A | * | 3/2007 |
| JP | 2007-201366 A | | 8/2007 |
| JP | 2008001554 A | | 1/2008 |
| JP | 2008235871 A | | 10/2008 |
| JP | 2010-018479 A | | 1/2010 |
| KR | 2009037109 A | * | 4/2009 |
| KR | 20100024569 A | | 3/2010 |
| WO | WO-2008-156311 A1 | | 12/2008 |
| WO | WO-2009081885 A1 | | 7/2009 |

OTHER PUBLICATIONS

Jeong Woong et al. "Investigating addition effect of hafnium in InZnO thin film transistors using a solution process." Applied Physics Letters, AIP, American Institute of Physics, Melville, NY, vol. 96, No. 9, Mar. 4, 2010, p. 93503.

Japanese Office Action dated Jan. 6, 2015 for corresponding Japanese Patent Application No. 2011-062603.

Office Action dated Jul. 7, 2015, of the corresponding European Patent Application No. 11159215.0.

Korean Office Action dated Nov. 28, 2016 for corresponding Korean Patent Application No. 10 2010 0106861.

* cited by examiner

THIN FILM TRANSISTORS, METHODS OF MANUFACTURING THIN FILM TRANSISTORS, AND SEMICONDUCTOR DEVICE INCLUDING THIN FILM TRANSISTORS

CROSS-REFERENCE TO RELATED APPLICATIONS

This application claims priority under 35 U.S.C. §119 to Korean Patent Applications No. 10-2010-0025162, filed on Mar. 22, 2010, and No. 10-2010-0106851 filed on Oct. 29, 2010 in the Korean Intellectual Property Office (KIPO), the entire contents of which are incorporated herein by reference.

BACKGROUND

1. Field

Example embodiments relate to thin film transistors, methods of manufacturing thin film transistors, and semiconductor device including thin film transistors.

2. Description of the Related Art

A thin film transistor (TFT) is used in various devices, and may be particularly used as a switching and driving device in a flat panel display, for example, a liquid crystal display (LCD), an organic light emitting diode display (OLED display) and/or an electrophoretic display (EPD).

A thin film transistor may generally include a gate electrode connected to a gate line transferring a scan signal, a source electrode connected to a data line transferring a signal applied to a pixel electrode, a drain electrode facing the source electrode, a semiconductor channel electrically connected to the source electrode and the drain electrode, and a gate insulating layer between the gate electrode and the semiconductor channel.

A semiconductor channel and a gate insulating layer may be primary components for determining characteristics of a thin film transistor. As a semiconductor of a semiconductor channel, silicon (Si) may be mainly used, and as a gate insulating layer, silicon oxide and/or nitrogen oxide may be mainly used. However, they may be limited in terms of manufacturing a high performance thin film transistor. Further, manufacturing costs may be high and the process may be complicated.

SUMMARY

Example embodiments may provide a thin film transistor with improved transistor characteristics made using a relatively simple manufacturing process. Other example embodiments may provide methods of manufacturing the thin film transistors. Still other example embodiments may provide semiconductor device including the thin film transistors.

A thin film transistor according to example embodiments includes a semiconductor channel disposed between a drain electrode and a source electrode; and a gate insulating layer disposed between the semiconductor channel and a gate electrode, wherein the semiconductor channel includes a first metal oxide, the gate insulating layer includes a second metal oxide, and at least one metal of the second metal oxide is the same as at least one metal of the first metal oxide.

The first metal oxide and the second metal oxide may commonly include at least one of zinc, indium, and tin. The first metal oxide and the second metal oxide may commonly include at least one of indium oxide, zinc oxide, tin oxide, indium tin oxide (ITO), indium zinc oxide (IZO), zinc tin oxide (ZTO), and indium zinc tin oxide (IZTO). At least one of the first metal oxide and the second metal oxide may include one of cerium (Ce), hafnium (Hf), magnesium (Mg), tantalum (Ta), lanthanum (La), silicon (Si), germanium (Ge), vanadium (V), niobium (Nb), yttrium (Y), and a combination thereof. At least one of the first metal oxide and the second metal oxide may independently include one selected from cerium indium zinc oxide (Ce-IZO), hafnium indium zinc oxide (Hf-IZO), or silicon indium zinc oxide (Si-IZO).

The first metal oxide may include one selected from cerium indium zinc oxide (Ce-IZO), hafnium indium zinc oxide (Hf-IZO), or silicon indium zinc oxide (Si-IZO), and the cerium (Ce), hafnium (Hf), or silicon (Si) may be respectively included in the content of more than about 0 and less than about 50 atomic parts, more than about 0 and less than about 80 atomic parts, or more than about 0 and less than about 100 atomic parts, based on 100 atomic parts of the zinc. The second metal oxide may include one selected from cerium indium zinc oxide (Ce-IZO), hafnium indium zinc oxide (Hf-IZO), or silicon indium zinc oxide (Si-IZO), and the cerium (Ce), hafnium (Hf), or silicon (Si) may be respectively included in the content of more than about 50 atomic parts, more than about 80 atomic parts, or more than about 100 atomic parts, based on 100 atomic parts of the zinc.

The metal may be included at different amounts in the first metal oxide and the second metal oxide. The amount of metal in the first metal oxide may be less than the amount in the second metal oxide. The thin film transistor may further include an auxiliary layer including an inorganic material and disposed between the gate electrode and the gate insulating layer, the gate electrode may be placed on a substrate. The thin film transistor may further include an etch stop layer disposed on the semiconductor channel. The thin film transistor may further include an etch stop layer disposed on the semiconductor channel, the gate electrode may be placed on a substrate. The drain electrode and the source electrode may be disposed on a substrate. At least one of the first metal oxide and the second metal oxide may be heat-treated.

A method of manufacturing the thin film transistor according to further example embodiments includes forming a gate electrode, forming a semiconductor channel at a position overlapping with the gate electrode by applying a first metal oxide precursor using a solution process, forming a gate insulating layer between the gate electrode and the semiconductor channel by applying a second metal oxide precursor using a solution process, the first metal oxide precursor and second metal oxide precursor commonly include at least one metal.

The first metal oxide precursor and the second metal oxide precursor may commonly include at least one precursor of an indium oxide, zinc oxide, tin oxide, indium tin oxide (ITO), indium zinc oxide (IZO), zinc tin oxide (ZTO) and indium zinc tin oxide (IZTO). At least one of the first metal oxide precursor and the second metal oxide precursor may include one of cerium (Ce), hafnium (Hf), magnesium (Mg), tantalum (Ta), lanthanum (La), silicon (Si), germanium (Ge), vanadium (V), niobium (Nb), yttrium (Y), or a combination thereof. At least one of the first metal oxide precursor and the second metal oxide precursor may include at least one precursor of cerium indium zinc oxide (Ce-IZO), hafnium indium zinc oxide (Hf-IZO) and silicon indium zinc oxide (Si-IZO). The cerium (Ce), hafnium (Hf) and silicon (Si) may be included in the content of more than about 0 and less than about 50 atomic parts, more than about 0 and less than about 80 atomic parts, or more than about 0 and less than 100 atomic parts, based on 100 atomic parts of the zinc.

The second metal oxide precursor may include a precursor of one selected from cerium indium zinc oxide (Ce-IZO), hafnium indium zinc oxide (Hf-IZO) and silicon indium zinc oxide (Si-IZO). The cerium (Ce), hafnium (Hf) or silicon (Si) may be included in the content of more than about 50 atomic parts, more than about 80 atomic parts, or more than about 100 atomic parts, based on 100 atomic parts of the zinc. The first metal oxide precursor may include a different amount of the at least one metal than the second metal oxide precursor. The amount of the at least one metal in the first metal oxide precursor is less than the amount of the at least one metal in the second metal oxide precursor.

The method may further include forming an auxiliary layer having an inorganic material between the gate insulating layer and the gate electrode and the gate electrode may be placed on a substrate. The method may further include forming an etch stop layer on the semiconductor channel. The method may further include forming an etch stop layer on the semiconductor channel and the gate electrode may be placed on a substrate. The method may further include forming a drain electrode and a source electrode on a substrate. The method may further include heat-treating at least one of the semiconductor channel and the gate insulating layer.

According to yet still further example embodiments, a semiconductor device includes a semiconductor layer and an insulating layer on the semiconductor layer, the insulating layer and the semiconductor layer commonly including at least one of a metal and a metalloid and the semiconductor layer and the insulating layer may include identical elements in different concentrations. At least one of the semiconductor layer and the insulating layer may include one of cerium indium zinc oxide (Ce-IZO), hafnium indium zinc oxide (Hf-IZO) and silicon indium zinc oxide (Si-IZO). The cerium (Ce), hafnium (Hf) and silicon (Si) in the semiconductor layer may be respectively included in the content of more than about 0 and less than about 50 atomic parts, more than about 0 and less than about 80 atomic parts, or more than about 0 and less than about 100 atomic parts, based on 100 atomic parts of the zinc, and the cerium (Ce), hafnium (Hf) and silicon (Si) in the insulating layer may be respectively included in the content of more than about 50 atomic parts, more than about 80 atomic parts, or more than about 100 atomic parts, based on 100 atomic parts of the zinc.

BRIEF DESCRIPTION OF THE DRAWINGS

Example embodiments will be more clearly understood from the following brief description taken in conjunction with the accompanying drawings. FIGS. 1-8 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
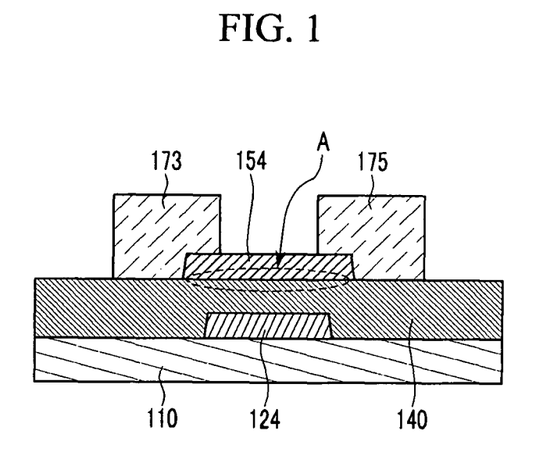
FIG. 1 is a cross-sectional diagram illustrating thin film transistors according to example embodiments.

FIG. 1 is a cross-sectional diagram illustrating thin film transistors according to example embodiments. Referring to FIG. 1, a thin film transistor with a bottom gate structure may be illustrated. The thin film transistor may include a substrate 110, a gate electrode 124, a gate insulating layer 140, a semiconductor channel 154, a source electrode 173 and a drain electrode 175. The gate electrode 124 may be connected with a gate line (not shown) extending in one direction along the substrate. The semiconductor channel 154 may overlap the gate electrode 124. A gate insulating layer 140 may cover the whole surface of the substrate and may be between the gate electrode 124 and the semiconductor channel 154. The source electrode 173 and the drain electrode 175 may be on the semiconductor channel 154, and may be electrically connected to the semiconductor channel 154 upon application of a voltage. The substrate 110 may be, for example, a glass, polymer, and/or silicon wafer.

The semiconductor channel 154 may include a first metal oxide. The gate insulating layer 140 may include a second metal oxide. The first metal oxide and the second metal oxide may include one or more metals in common. Although example embodiments are described in terms of a metal, example embodiments are not so limited. For example, the metal may be a metalloid or a combination of a metal and a metalloid. The metal may be one or more of indium (In), zinc (Zn), tin (Sn) and a combination thereof. The first metal oxide and the second metal oxide may include one or more of indium oxide, zinc oxide, tin oxide, indium tin oxide (ITO), indium zinc oxide (IZO) and/or zinc tin oxide (ZTO), in common.

At least one of the first metal oxide and the second metal oxide may independently include at least one of cerium (Ce), hafnium (Hf), magnesium (Mg), tantalum (Ta), lanthanum (La), silicon (Si), germanium (Ge), vanadium (V), niobium (Nb), yttrium (Y), and a combination thereof. These may be included in the first metal oxide and/or the second metal oxide to, for example, improve the characteristics of the thin film transistor (e.g., threshold voltage). For example, the first metal oxide and the second metal oxide may include indium zinc oxide (IZO) containing indium (In) and zinc (Zn) in common. One of the first metal oxide and the second metal oxide may include cerium indium zinc oxide (Ce-IZO), hafnium indium zinc oxide (Hf-IZO), and/or silicon indium zinc oxide (Si-IZO) (e.g., independently further including cerium (Ce), hafnium (Hf), or silicon (Si)).

Cerium indium zinc oxide (Ce-IZO) may have a semiconductor characteristic if cerium (Ce) is included in the content of more than about 0 and less than about 50 atomic parts based on 100 atomic parts of zinc (Zn). Cerium indium zinc oxide (Ce-IZO) may have an insulating property if the cerium (Ce) is included in the content of more than about 50 atomic parts based on 100 atomic parts of the zinc (Zn). Herein, atomic parts may be used to describe a relative ratio, for example, a relative ratio among metal components.

Hafnium indium zinc oxide (Hf-IZO) may have a semiconductor characteristic if hafnium (Hf) is included in the content of more than about 0 and less than about 80 atomic parts based on the 100 atomic parts of the zinc (Zn). Hafnium indium zinc oxide (Hf-IZO) may have an insulating property if the hafnium (Hf) is included in the content of more than about 80 atomic parts based on 100 atomic parts of the zinc (Zn).

Silicon indium zinc oxide (Si-IZO) may have a semiconductor characteristic if silicon (Si) is included in the content of more than about 0 and less than about 100 atomic parts based on the 100 atomic parts of the zinc (Zn). Silicon indium zinc oxide (Si-IZO) may have an insulating property if the silicon (Si) is included in the content of more than about 100 atomic parts based on 100 atomic parts of the zinc (Zn).

The semiconductor channel and the gate insulating layer may be metal oxides that include at least one metal in common, and the ratio of, for example, a metal element and an oxygen fraction of each metal oxide may be varied to respectively bring about a semiconductor characteristic and an insulating characteristic. The metal element may be included at different amounts in the semiconductor channel and the gate insulating layer. For example, the amount of the metal element in the semiconductor channel may be less than the amount of the metal element in the gate insulating layer. By using a semiconductor channel and a gate insulating layer with metal oxides of homologous series, heterogeneity at the interface A between the semiconductor channel and the gate insulating layer may be decreased. Charge loss from a channel region of the thin film transistor may be reduced and characteristics of the thin film transistor may be improved.

Methods of manufacturing a thin film transistor of FIG. 1 may include depositing a first conductor (not shown) on a substrate 110. The conductor may be photolithographed to form a gate line (not shown) including a gate electrode 124. A gate insulating layer 140 and the semiconductor channel 154 may be sequentially formed on the gate electrode 124. A second conductor (not shown) may be deposited thereon and photolithographed to form a source electrode 173 and a drain electrode 175. The gate insulating layer 140 and the semiconductor channel 154 may be formed by a solution process each using a metal oxide precursor. The metal oxide precursor for forming the semiconductor channel 154 (hereinafter referred to as "first metal oxide precursor") and the metal oxide precursor for forming the gate insulating layer (hereinafter referred to as "second metal oxide precursor") may include at least one metal in common.

The first metal oxide precursor and the second metal oxide precursor may include, for example, at least one of an indium (In)-containing compound, a zinc (Zn)-containing compound, a tin (Sn)-containing compound, and a combination thereof, in common. The indium-containing compound may be at least one selected from an indium salt, an indium hydroxide, an indium alkoxide, and hydrates thereof, but is not limited thereto. Examples of a salt may include an acetate, a carbonyl, a carbonate, a nitrate, a sulfate, a phosphate, and/or a halide. Examples of an indium-containing compound may include indium acetyl acetonate, indium acetate, indium chloride, indium isopropoxide, and/or hydrates thereof. The zinc-containing compound may be at least one of a zinc salt, a zinc hydroxide, a zinc alkoxide and hydrates thereof, but is not limited thereto. Examples of the zinc-containing compound may include zinc acetate (Zn$(CH_3COO)_2$), zinc nitrate, zinc acetylacetonate, zinc chloride and/or hydrates thereof.

A tin-containing compound may be at least one of a tin salt, a tin hydroxide, a tin alkoxide and hydrates thereof, but is not limited thereto. Examples of the tin-containing compound may include tin acetate (Sn$(CH_3COO)_2$), tin nitrate, tin acetylacetonate, tin chloride, and/or hydrates thereof. The zinc-containing compound, the indium-containing compound and the tin-containing compound may be variously combined. The first metal oxide precursor and the second metal oxide precursor may further include a compound containing another metal and/or metalloid in addition to the above-described metal. The metal and/or metalloid may be, for example, cerium (Ce), hafnium (Hf), magnesium (Mg), tantalum (Ta), lanthanum (La), silicon (Si), germanium (Ge), vanadium (V), niobium (Nb), yttrium (Y) and/or a combination thereof. The compound containing the same metal may be introduced as, for example, a halide, an acetate compound, a carbonyl compound, a carbonate compound, a nitride compound and/or an alkoxide compound.

The metal-containing compounds may function to determine a threshold voltage when the metal oxide prepared from the metal oxide precursor is applied to a thin film transistor and may improve the characteristics of the thin film transistor. The metal-containing compound may be included respectively in the content of about 0.01 to 30 wt % based on the total amount of the metal oxide precursor. When each component is included within the range, solubility may be secured.

The metal oxide precursor solution may further include a solution stabilizer. The solution stabilizer may include at least one of an alcohol amine compound, an alkyl ammonium hydroxy compound, an alkyl amine compound, a ketone compound, an acid compound, a base compound and/or deionized water. For example, the solution stabilizer may include at least one of monoethanolamine, diethanolamine, triethanolamine, monoisopropylamine, N,N-methylethanolamine, aminoethyl ethanolamine, diethyleneglycolamine, 2-(aminoethoxy)ethanol, N-t-butylethanolamine, N-t-butyldiethanolamine, tetramethylammonium hydroxide, methylamine, ethylamine, acetylacetone, hydrochloric acid, nitric acid, sulfuric acid, acetic acid, ammonium hydroxide, potassium hydroxide, and sodium hydroxide.

The solution stabilizer may be included in the metal oxide precursor solution to increase solubility of other components and may facilitate the formation of a uniform thin film. The solution stabilizer, although varied depending on the kinds and contents of other components as described above, may be included in the content of about 0.01 to 30 wt % based on the total amount of the precursor solution. When the solution stabilizer is included within the range, solubility and thin film coatability may be increased.

The metal-containing compound and the solution stabilizer may be mixed in a solvent and prepared as a metal oxide precursor. If two or more metal-containing compounds are used, they may be respectively prepared as a solution in each solvent and mixed, and/or they may be mixed in one solvent together. The solution stabilizer may be respectively added to each component solution and/or it may be added after mixing each solution. For example, zinc acetate and indium acetyl acetonate may be mixed in separate solvents to respectively prepare a zinc acetate solution and an indium acetyl acetonate solution, the solutions may be mixed, and hafnium chloride and/or a hafnium chloride-containing solution may be added thereto to prepare a metal oxide precursor.

The solvent is not specifically limited as long as it dissolves the above-described components, and examples may include deionized water, methanol, ethanol, propanol, isopropanol, 2-methoxyethanol, 2-ethoxyethanol, 2-propoxyethanol 2-butoxyethanol, methylcellosolve, ethylcellosolve, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethyether, methylmethoxypropionate, ethylethoxypropionate, ethyl lactate, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethyl formamide (DMF), N,N-dimethyl acetamide (DMAc), N-methyl-2-pyrrolidone, γ-butyrolactone, diethylether, ethyleneglycoldimethylether, diglyme, tetrahydrofuran, acetylacetone, and/or acetonitrile.

The solvent may be included in the remaining content in addition to the above described components, based on the total amount of the metal precursor. The forming of the gate insulating layer may include applying the second metal oxide precursor on the substrate and then heat treating the second metal oxide precursor to form a gate insulting layer including the metal oxide. The forming of the semiconductor channel may include applying the first metal oxide precursor on the gate insulating layer and then heat treating the first metal oxide precursor to form a semiconductor channel including the metal oxide. The first metal oxide precursor and the second metal oxide precursor may be applied on the substrate by, for example, spin coating, slit coating, Inkjet printing, spraying, dipping and/or the like.

The metal oxide precursor applied on the substrate may be heat treated to form a metal oxide. The heat treatment may be conducted by prebaking at a relatively low temperature to reduce a solvent content of the metal oxide precursor and performing a heat treatment at a relatively high temperature to form the metal oxide. The heat treatment temperature may be about 300 to about 600° C. Because a thin film transistor according to example embodiments may include both a gate insulating layer and a semiconductor channel by a solution process, a high and/or improved performance thin film transistor may be manufactured without using a method that requires a high cost and a complicated process such as chemical vapor deposition (CVD) method or sputtering.

Figure 2:
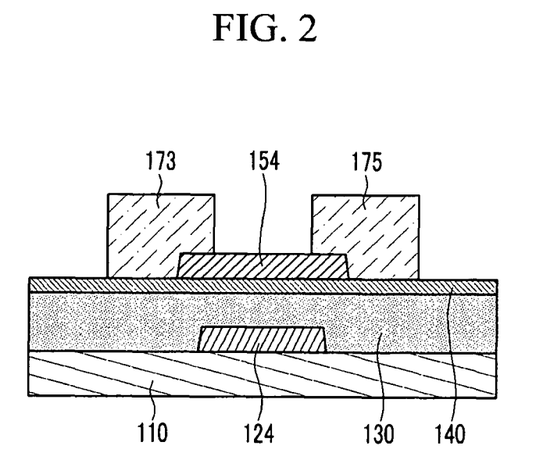
FIG. 2 is a cross-sectional diagram illustrating thin film transistors according to other example embodiments.

FIG. 2 is a cross-sectional diagram illustrating thin film transistors according to other example embodiments. Referring to FIG. 2, a gate electrode 124 may be on a substrate 110. An auxiliary layer 130 may be on the gate electrode 124. A gate insulating layer 140 may be on the auxiliary layer 130. A semiconductor channel 154, a source electrode 173 and a drain electrode 175 may be on the gate insulating layer 140. The auxiliary layer 130 may be, for example, an inorganic insulating material (e.g., silicon nitride and/or silicon oxide). The auxiliary layer 130 may decrease a level difference due to the gate electrode 124 (e.g., improve surface planarity) to uniformly form the gate insulating layer 140 and the semiconductor channel 154 by a solution process. The gate insulating layer 140 and the semiconductor channel 154 may include a first metal oxide and a second metal oxide with at least one metal in common, for example, as described above with respect to FIG. 1.

Figure 3:
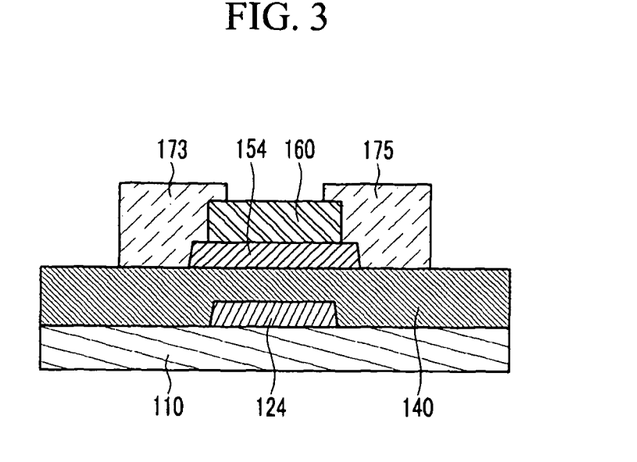
FIGS. 3 and 4 are cross-sectional diagrams illustrating thin film transistors according to still other example embodiments.
Figure 4:
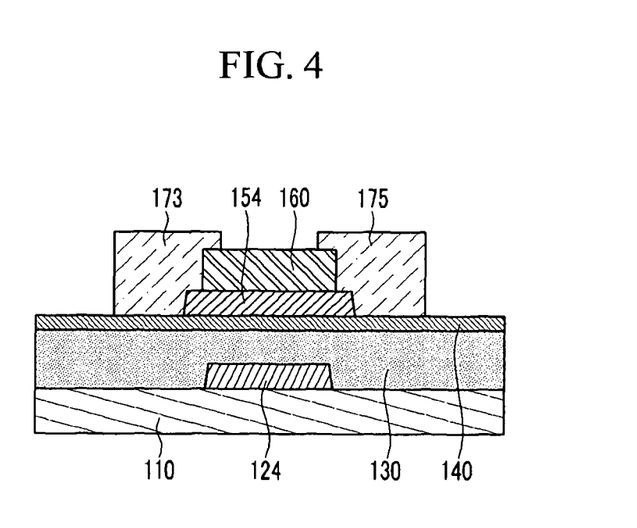

FIGS. 3 and 4 are cross-sectional diagrams illustrating thin film transistors according to still other example embodiments. Referring to FIG. 3, a gate electrode 124 and a gate insulating layer 140 may be on a substrate 110. A semiconductor channel 154 may be on the gate insulating layer 140. An etch stop layer 160 may be on the semiconductor channel 154. A source electrode 173 and a drain electrode 175 may be on the semiconductor channel 154 and the etch stop layer 160. The etch stop layer 160 may prevent or reduce damage to a channel region of the semiconductor channel 154 between the source electrode 173 and the drain electrode 175, and may prevent and/or reduce deterioration of the characteristics of the thin film transistor. The gate insulating layer 140 and the semiconductor channel 154 may include a first metal oxide and a second metal oxide with at least one metal in common, for example, as described above with respect to FIG. 1.

Referring to FIG. 4, a gate electrode 124 may be on a substrate 110. An auxiliary layer 130 may be on the gate 124 and the substrate 110. A gate insulating layer 140 may be on the auxiliary layer 130. A semiconductor channel 154 may be on the gate insulating layer 140. An etch stop layer 160 may be on the semiconductor channel 154. A source electrode 173 and a drain electrode 175 may be on the semiconductor channel 154 and the etch stop layer 160. The thin film transistor according to example embodiments may include a auxiliary layer 130 under the gate insulating layer 140, and may include the etch stop layer 160 on the semiconductor channel 154.

Planarity may be improved for formation of the gate insulating layer 140 and the semiconductor channel 154 by a solution process. Uniformity of film thickness may be increased. Damage to the channel region of the semiconductor channel 154 may be prevented and/or reduced to prevent and/or reduce deterioration of the characteristics of the thin film transistor. The gate insulating layer 140 and the semiconductor channel 154 may include a first metal oxide and a second metal oxide with at least one metal in common, for example, as described above with respect to FIG. 1.

Figure 5:
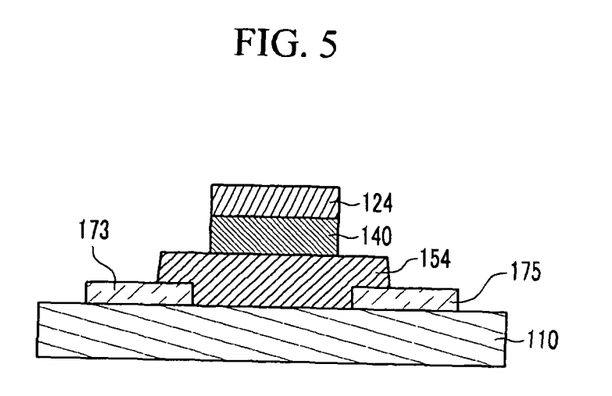
FIG. 5 is a cross-sectional diagram illustrating thin film transistors according to further example embodiments.

FIG. 5 is a cross-sectional diagram illustrating thin film transistors according to further example embodiments. Referring to FIG. 5, a thin film transistor with a top gate structure may be illustrated. A source electrode 173 and a drain electrode 175 may be on a substrate 110. A semiconductor channel 154 partially overlapping with the source electrode 173 and the drain electrode 175 may be on the source electrode 173, the drain electrode 175 and the substrate 110. A gate insulating layer 140 may be on the semiconductor channel 154. A gate electrode 124 may be on the gate insulating layer 140 at a position overlapping the semiconductor channel 154.

The gate insulating layer 140 and the semiconductor channel 154 may include a first metal oxide and a second metal oxide with at least one metal in common, for example, as described above with respect to FIG. 1. Thin film transistors according to various example embodiments may be used as switching and/or driving devices in, for example, display devices. The display devices may include a liquid crystal display (LCD), an organic light emitting diode (OLED) display, an electrophoretic display and similar devices.

EXAMPLES

Preparation of Metal Oxide Precursor for Semiconductor Channel

Indium nitrate and zinc acetate may be dissolved in 2-methoxyethanol so that the mole ratio of indium (In):zinc (Zn) may become about 3:1 to prepare a solution of about 0.2M. Acetic acid with the same equivalent weight as zinc acetate and ethanol amine with the same equivalent weight as zinc acetate may be added to prepare a metal oxide precursor for a semiconductor channel.

Preparation of Metal Oxide Precursor for Gate Insulating Layer-1

Indium nitrate, zinc acetate, and Ce ethoxide may be dissolved in 2-methoxyethanol so that the mole ratio of indium (In):zinc (Zn):cerium(Ce) may become about 3:1:0.5 to prepare a solution of about 0.2M. Acetic acid and ethanol amine with the same equivalent as zinc acetate may be added to prepare a metal oxide precursor 1 for a gate insulating layer.

Preparation of Metal Oxide Precursor for Gate Insulating Layer-2

Indium nitrate, zinc acetate and Ce ethoxide may be dissolved in 2-methoxyethanol so that the mole ratio of indium (In):zinc (Zn):cerium(Ce) may become about 3:1:2 to prepare a solution of about 0.2M. Acetic acid and ethanol amine with the same equivalent as zinc acetate may be added to prepare a metal oxide precursor 2 for a gate insulating layer.

Manufacture of Thin Film Transistor

On a glass substrate, molybdenum may be formed to a thickness of about 2000 Å by sputtering, and may be photolithographed to form a gate electrode. Silicon nitride may be deposited to a thickness of about 4000 Å by chemical vapor deposition (CVD) (e.g., plasma enhanced chemical vapor deposition (PECVD)). The metal oxide precursor 2 may be spin coated thereon at a speed of about 500-3000 rpm. A primary heat treatment may be conducted at a temperature of about 300° C. for about 30 minutes to reduce the solvent content of the metal oxide precursor 2. A secondary heat treatment may be conducted at a temperature of about 450° C. for about 3 hours to form a gate insulating layer.

The metal oxide precursor 1 may be spin coated at a speed of about 3000 rpm. A primary heat treatment may be conducted at a temperature of about 300° C. for about 30 minutes. A secondary heat treatment may be conducted at a temperature of about 450° C. for about 3 hours to form a semiconductor channel. After patterning the semiconductor channel, silicon oxide (SiO2) may be deposited thereon to a thickness of about 2000 Å by chemical vapor deposition (CVD), and may be patterned to form an etch stop layer. Molybdenum may be formed to a thickness of about 2000 Å by sputtering, and may be photolithographed to form a source electrode and a drain electrode.

Insulating Characteristic

The metal oxide precursors 1 and 2 may be respectively spin coated onto a silicon wafer at a speed of about 500 rpm to form a thin film.

Figure 6:
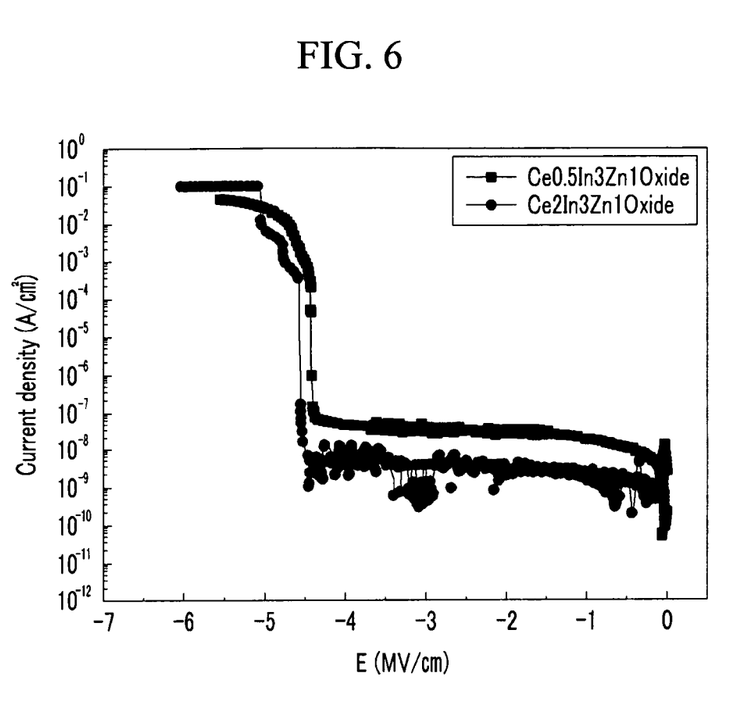
FIGS. 6 and 7 are graphs illustrating insulating characteristics of a gate insulating layer formed from a metal oxide precursor prepared according to example embodiments.
Figure 7:
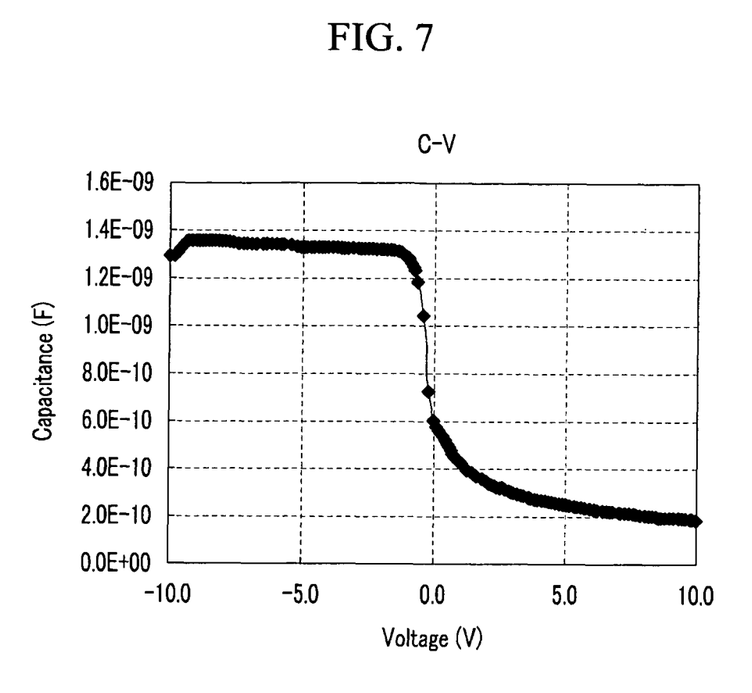

FIGS. 6 and 7 are graphs illustrating insulating characteristics of a gate insulating layer formed from a metal oxide precursor prepared according to example embodiments. Referring to FIGS. 6 and 7, a breakdown electric field may be about 4.5 MV/cm on the basis of 1e-6A and a low current density may be maintained under a constant electric field. A capacitance characteristic illustrated in FIG. 7 may be an insulating characteristic.

Thin Film Transistor Characteristic

Figure 8:
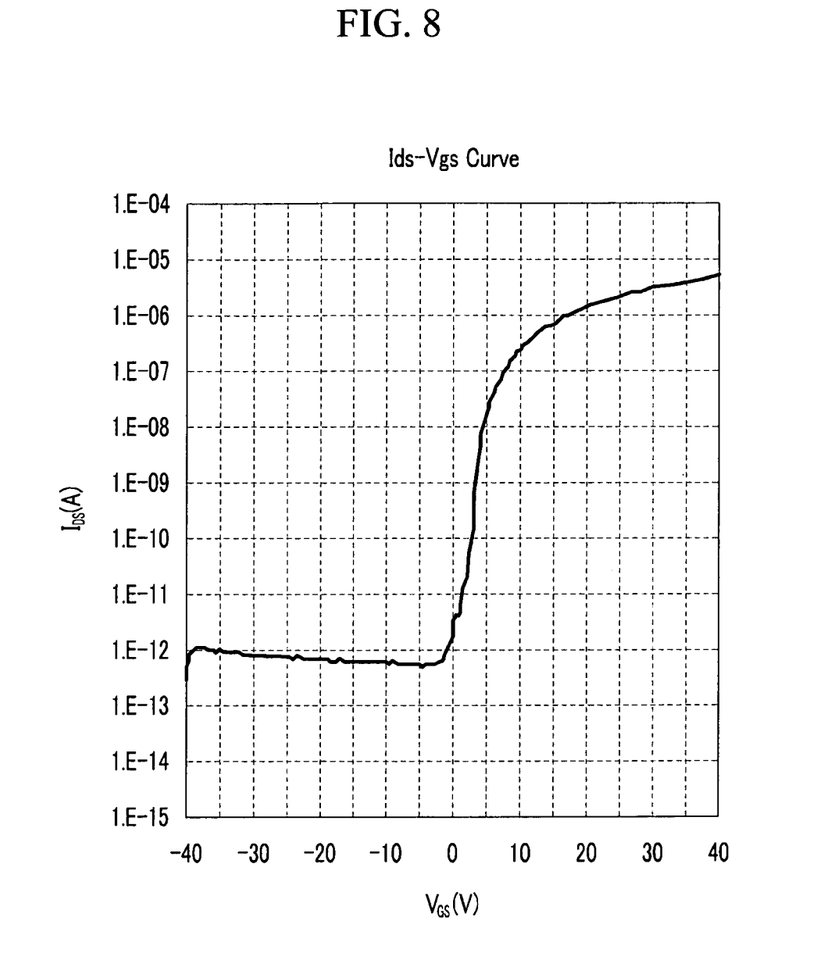
FIG. 8 is a graph illustrating current characteristics of a thin film transistor according to example embodiments.

The current characteristic of a thin film transistor according to the example may be measured. FIG. 8 is a graph illustrating current characteristics of a thin film transistor according to example embodiments. Referring to FIG. 8, a turn-on voltage of a thin film transistor according to the example may be about 0.2V, a sub-threshold slope may be about 0.5V/dec and a high current characteristic with $I_{on/off}$ may be about $1 \times 10^7$ or more. Excellent and/or improved characteristics may be confirmed in a thin film transistor according to example embodiments.

While example embodiments have been particularly shown and described, it will be understood by one of ordinary skill in the art that variations in form and detail may be made therein without departing from the spirit and scope of the claims.

What is claimed is:

1. A thin film transistor comprising:
   a semiconductor channel disposed between a drain electrode and a source electrode; and
   a gate insulating layer disposed between the semiconductor channel and a gate electrode,
   wherein the semiconductor channel includes a first metal oxide, the gate insulating layer includes a second metal oxide, the second metal oxide not being identical to the first metal oxide,
   at least a portion of the gate insulating layer that includes the second metal oxide is in direct contact with the semiconductor channel,
   the first metal oxide and the second metal oxide commonly include at least one of indium tin oxide (ITO), zinc tin oxide (ZTO), and indium zinc tin oxide (IZTO), and
   at least one of the first metal oxide and the second metal oxide includes one of cerium (Ce), hafnium (Hf), tantalum (Ta), lanthanum (La), niobium (Nb), yttrium (Y) and combinations thereof.

2. The thin film transistor of claim 1, wherein the first metal oxide and the second metal oxide commonly include at least one metal selected from zinc, indium, and tin included in the at least one of indium tin oxide (ITO), zinc tin oxide (ZTO), and indium zinc tin oxide (IZTO), and
   the first metal oxide includes a different amount of the at least one metal than the second metal oxide.

3. The thin film transistor of claim 2, wherein an amount of the at least one metal in the first metal oxide is less than an amount of the at least one metal in the second metal oxide.

4. The thin film transistor of claim 1, further comprising:
   an auxiliary layer including an inorganic material and disposed between the gate electrode and the gate insulating layer, wherein the gate electrode is placed on a substrate.

5. The thin film transistor of claim 1, further comprising:
   an etch stop layer disposed on the semiconductor channel.

6. The thin film transistor of claim 1, further comprising:
   an etch stop layer disposed on the semiconductor channel, wherein the gate electrode is placed on a substrate.

7. The thin film transistor of claim 1, wherein the drain electrode and the source electrode are disposed on a substrate.

8. The thin film transistor of claim 1, wherein at least one of the first metal oxide and the second metal oxide is heat-treated.

9. A thin film transistor comprising:
   a semiconductor channel between a drain electrode and a source electrode; and
   a gate insulating layer between the semiconductor channel and a gate electrode,
   wherein the semiconductor channel includes a first metal oxide, the gate insulating layer includes a second metal oxide, the second metal oxide not being identical to the first metal oxide,
   at least a portion of the gate insulating layer that includes the second metal oxide is in direct contact with the semiconductor channel,
   the first metal oxide and the second metal oxide commonly include indium zinc oxide (IZO),
   the first metal oxide includes one of cerium indium zinc oxide (Ce-IZO) and hafnium indium zinc oxide (Hf-IZO),
   the cerium (Ce) is included in the content of more than about 0 and less than about 50 atomic parts based on 100 atomic parts of the zinc, and
   the hafnium (Hf) is included in the content of more than about 0 and less than about 80 atomic parts based on 100 atomic parts of the zinc.

10. A thin film transistor comprising:
    a semiconductor channel between a drain electrode and a source electrode; and
    a gate insulating layer between the semiconductor channel and a gate electrode,
    wherein the semiconductor channel includes a first metal oxide, the gate insulating layer includes a second metal oxide, the second metal oxide not being identical to the first metal oxide,
    at least a portion of the gate insulating layer that includes the second metal oxide is in direct contact with the semiconductor channel,
    the first metal oxide and the second metal oxide commonly include indium zinc oxide (IZO),
    the second metal oxide includes one selected from cerium indium zinc oxide (Ce-IZO) and hafnium indium zinc oxide (Hf-IZO),
    the cerium (Ce) is included in the content of more than about 50 atomic parts based on 100 atomic parts of the zinc, and
    the hafnium (Hf) is included in the content of more than about 80 atomic parts based on 100 atomic parts of the zinc.

* * * * *